United States Patent [19]

Choi

[11] Patent Number: 5,648,781

[45] Date of Patent: Jul. 15, 1997

[54] METHOD AND APPARATUS FOR REMOTELY CONTROLLING ELECTRICAL APPLIANCES USING A TRACKBALL AND DISPLAY

[75] Inventor: Eun-suk Choi, Seoul, Rep. of Korea

[73] Assignee: Samsung Electronics Co., Ltd., Kyungki-Do, Rep. of Korea

[21] Appl. No.: 546,135

[22] Filed: Oct. 20, 1995

[30] Foreign Application Priority Data

Oct. 22, 1994 [KR] Rep. of Korea .................. 94-27076

[51] Int. Cl.⁶ .................................................. G08C 19/12
[52] U.S. Cl. ............... 341/176; 340/825.24; 340/825.72; 345/157; 345/158; 345/162; 348/569; 341/22
[58] Field of Search ........................... 341/176, 35, 173; 340/22, 825.24, 825.25, 825.5, 825.72; 364/190; 345/157, 163; 348/569, 162

[56] References Cited

U.S. PATENT DOCUMENTS

| 5,448,240 | 9/1995 | Morita | 341/176 |
|---|---|---|---|
| 5,457,446 | 10/1995 | Yamamoto | 340/825.24 |
| 5,488,427 | 1/1996 | Choi | 348/569 |
| 5,532,753 | 7/1996 | Bochner | 348/569 |

*Primary Examiner*—Jeffery Hofsass
*Assistant Examiner*—Albert K. Wong
*Attorney, Agent, or Firm*—Sughrue, Mion, Zinn, Macpeak & Seas

[57] ABSTRACT

A remote control method and apparatus thereof performs the remote control of electrical appliances using control menus corresponding to functions of the electrical appliances, which are displayed on a television screen and selected by using a trackball installed on the remote control apparatus. The remote control system includes a remote controller and an electrical appliance. The remote control includes trackball, a trackball movement sensor, a shift value data storage, a data generator, a control commander and a transmitter. The appliance includes a receiver, a menu display, a menu display information storage, a cursor display, and a menu contents execution unit. Thus, the operation of electrical appliances is made more user friendly. The present invention also reduces the complexity and difficulty of operating a remote controller by reducing the number of keys on a remote controller.

6 Claims, 6 Drawing Sheets

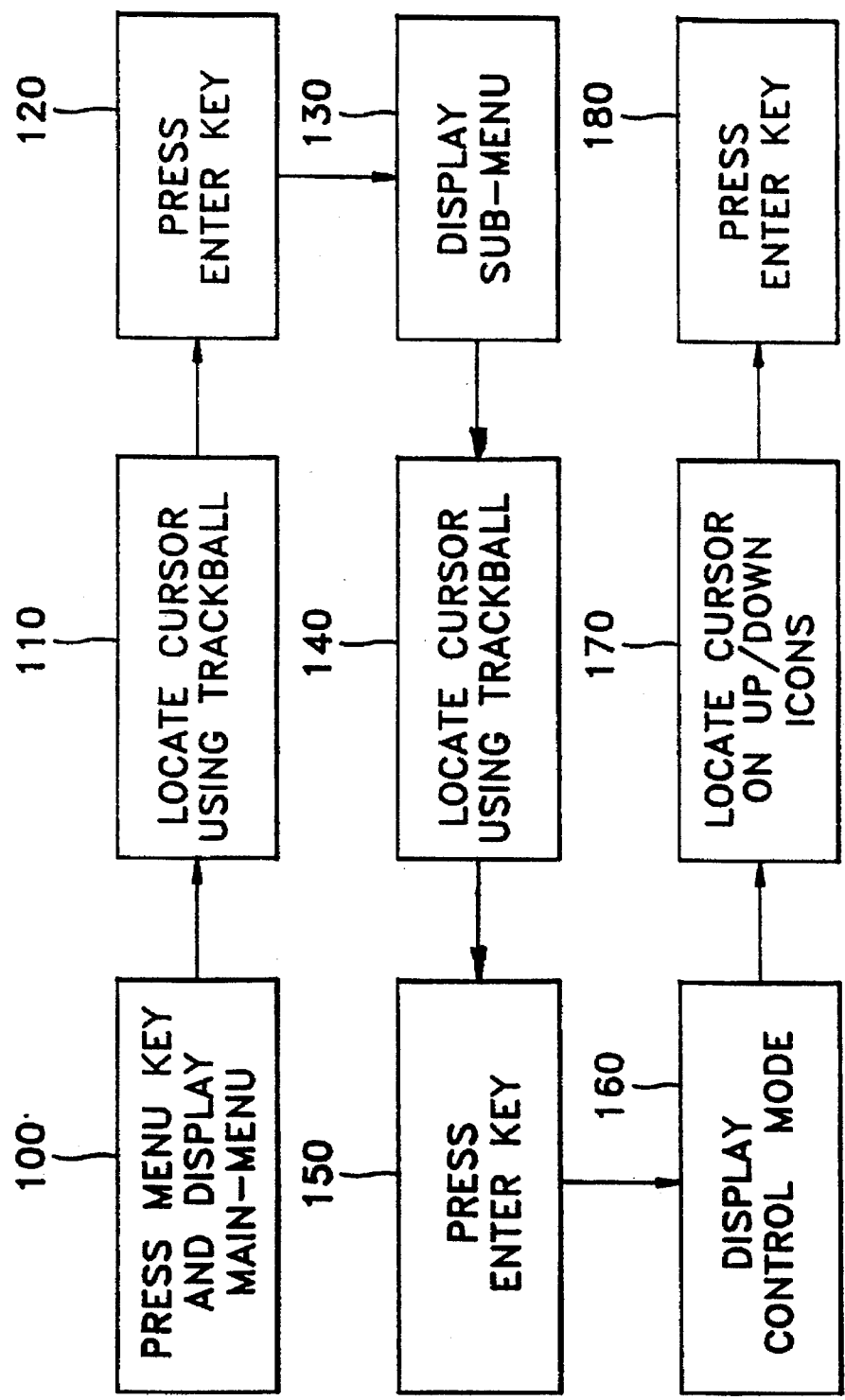

METHOD AND APPARATUS FOR REMOTELY CONTROLLING ELECTRICAL APPLIANCES USING A TRACKBALL AND DISPLAY

BACKGROUND OF THE INVENTION

The present invention relates to a method and apparatus for performing the remote control of electrical appliances. More specifically, the present invention relates to a remote control method and apparatus for remotely controlling a television and other appliances.

Remote control apparatuses having a variety of functions have been developed according to the advance of the electrical appliances themselves. Currently, even a plurality of such appliances, generally including a television or displays means, can be controlled using a single remote controller. Along with such technical advances, however, the conventional remote control has become so complex that the average user is burdened with learning an extensive set of functions for each appliance to be controlled, such that its original purpose, i.e., convenience, has been defeated. Thus, a simplified remote controller, one which has fewer keys and is user-friendly, is needed.

SUMMARY OF THE INVENTION

Therefore, it is an object of the present invention to provide a remote control method and apparatus wherein various functions can be operated simply.

To accomplish one aspect of the above object, there is provided a remote control apparatus for performing the remote control of electrical appliances including a television, in which menu icons with predetermined control contents are displayed on the screen of the television. The apparatus has a trackball for controlling the movement of a cursor so as to select each menu icon displayed on the screen. A trackball movement sensing means is provided for sensing the movement of the trackball along X-Y coordinates. Shift value data corresponding to the X-Y coordinates sensed by the trackball movement sensing means is stored in a shift value data storage unit. A data generating means for generating data corresponding to the shift value data stored in the shift value data storage unit is coupled to a transmitting means for coding and transmitting the data of the data generating means to a predetermined receiver, as is a control commander which is used to select the predetermined control contents of the menu icon displayed on the screen where the cursor is located.

To accomplish another aspect of the above object, there is provided a remote control method for performing the remote control of electrical appliances including a television connected with the electrical appliances, in which menu icons having predetermined control contents for controlling the television and electrical appliances, a main menu, sub-menus pertaining thereto and control modes of the sub-menus, and a cursor are displayed on the screen of the television.

The method comprises the steps of:

(1) displaying the menu icons and cursor on the screen by operating a remote controller, the cursor being initially displayed on a predetermined position of the screen according to the X-Y coordinates thereof;

(2) selecting a desired menu icon among the displayed menu icons, by controlling a trackball installed on a remote controller so that shift value data calculated on the basis of the predetermined initial position of the cursor is transmitted to a receiver of the television; and (3) operating an enter key installed on the remote controller and thereby performing the command function corresponding to the predetermined control contents of the selected menu icon on which the cursor is located.

BRIEF DESCRIPTION OF THE DRAWINGS

The above objects and advantages of the present invention will become more apparent by describing in detail a preferred embodiment thereof with reference to the attached drawings in which:

FIG. 1 is a flow chart of the process for controlling a television and various electrical appliances;

FIG. 2A shows the display state of a television screen corresponding to step 100 of the method of the present invention;

FIG. 2B shows the display state of a television screen corresponding to step 110 of the method of the present invention;

FIG. 2C shows the display state of a television screen corresponding to step 130 of the method of the present invention;

FIG. 2D shows the display state of a television screen corresponding to step 140 of the method of the present invention;

FIG. 2E shows the display state of a television screen corresponding to step 160 of the method of the present invention;

FIG. 2F shows the display state of a television screen corresponding to step 170 of the method of the present invention;

FIG. 2G shows the display state of a television screen corresponding to step 180 of the method of the present invention.

DETAILED DESCRIPTION OF THE PREFERRED EMBODIMENT

Figure 2A:
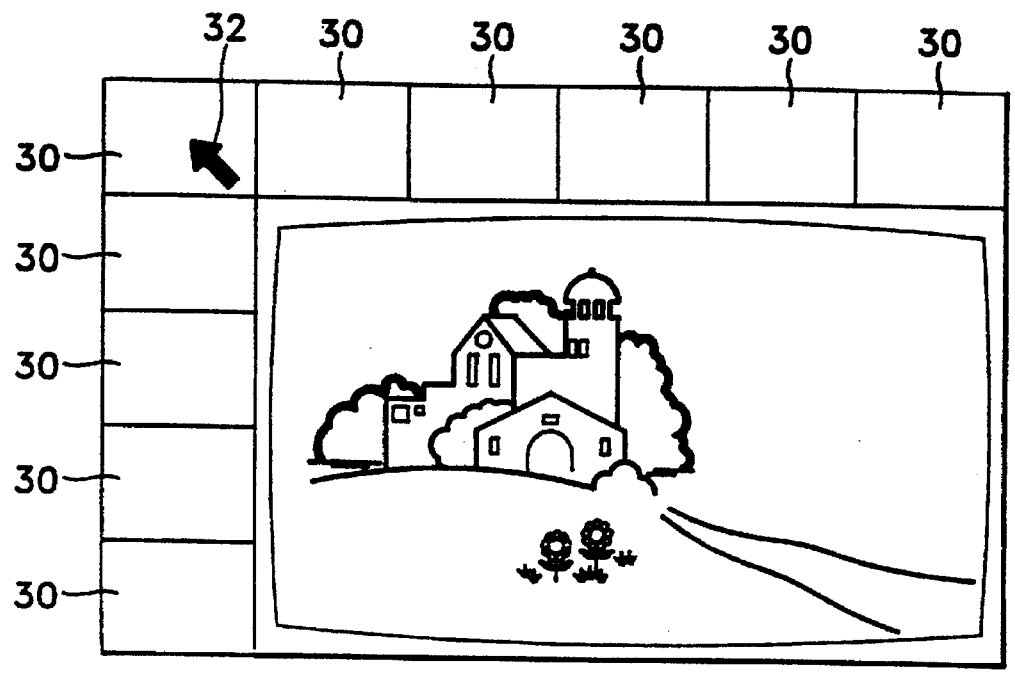
FIGS. 2A-2G are views for illustrating the sequentially displayed states of a television screen, during the process of controlling the television and various electrical appliances.

According to the present invention, a trackball is integrated with a remote controller having, in addition to general control keys for various electrical appliances, a menu key and an enter key. Using this remote controller, various menus for controlling an electronic appliance are displayed on a predetermined monitor as icons. A user directly controls the trackball to thereby move a cursor onto the displayed icons. When the enter key on the remote controller is pressed after the cursor is fixed on a desired icon of the menu, the function corresponding to the icon on which the cursor is located is performed.

Also, when a displayed icon is selected, a sub-menu pertaining thereto is displayed, and when one of the sub-menu icons is selected, a control mode corresponding to the sub-menu is displayed accordingly, such that the intended control is performed corresponding to an increase or decrease of the number of highlighted vertical bars which are horizontally arrayed across the bottom of the screen to indicate the degree to which the control is performed.

FIG. 1 is a flow chart of the process for controlling a television and various electrical appliances, and FIGS. 2A-2G are views for illustrating the sequentially displayed states of the television screen. In FIGS. 2A-2G, reference numeral 30 denotes main-menu icons, reference numeral 32 denotes the cursor, reference numeral 34 denotes the sub-menus.

Referring to FIG. 1, step 100 is a step in which, when a menu-key of a remote controller is pressed, a main menu is displayed on a system monitor (i.e., the screen of a general television), such that a cursor is initially located at a predetermined screen position. As shown in FIG. 2A, the initial screen position of the cursor 32 is in the upper-left corner, but the initial position may be set anywhere on the screen. When an initial screen image in which main-menu icons 30 are arranged is displayed, the cursor 32 is always located on the coordinates designated as initial values thereof.

Figure 2B:
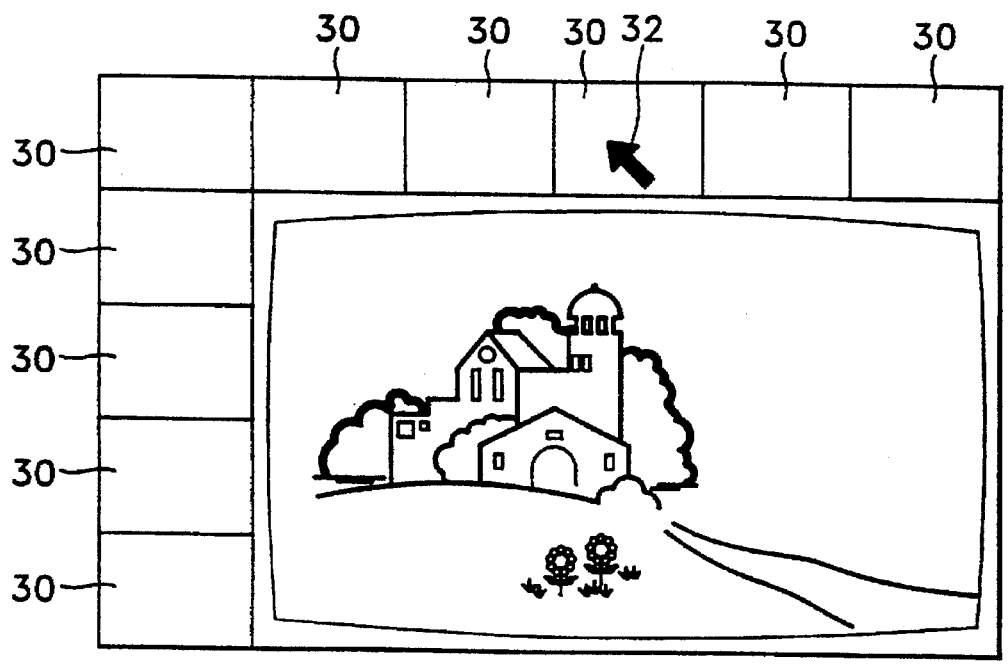

Step 110 is a step in which the cursor is located by a user on an intended main-menu icon by controlling the trackball. This step is shown in FIG. 2B.

Figure 2C:
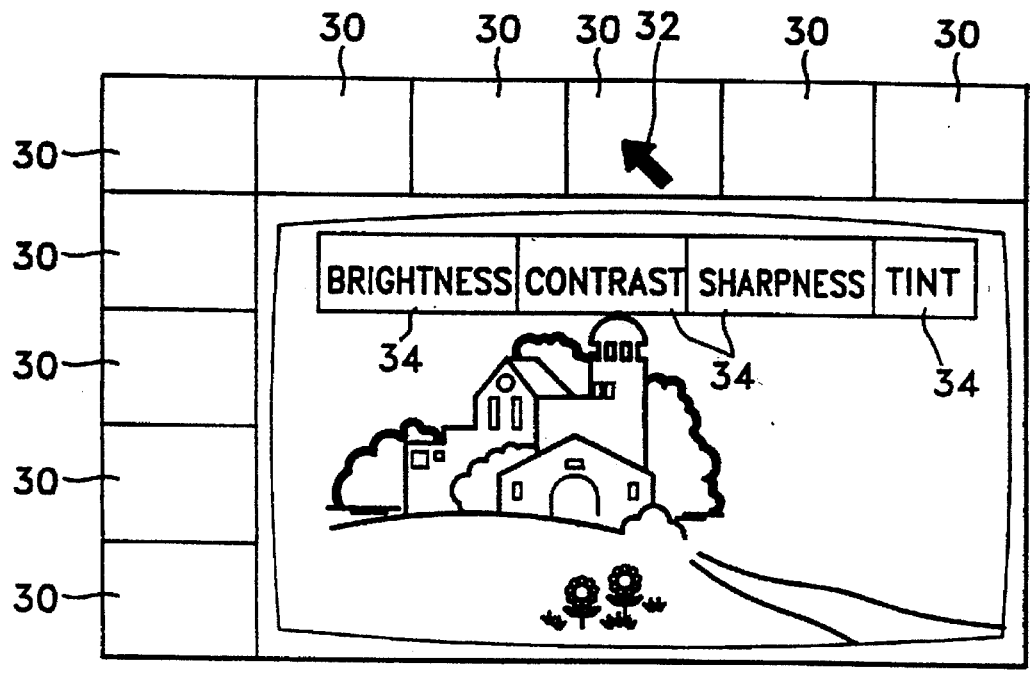

Step 120 is a step in which an enter key on the remote controller is pressed to perform the function of the main-menu icon selected in step 110. Step 130 is where the function is performed, that is, a sub-menu corresponding to the main-menu icon selected in step 120 is displayed. For example, if the main-menu icon "screen status" is selected in steps 110 and 120, the sub-menu displayed in step 130 may include sub-menu icons 34 such as "BRIGHTNESS," "CONTRAST," "SHARPNESS" and "TINT," as shown in FIG. 2C.

Figure 2D:
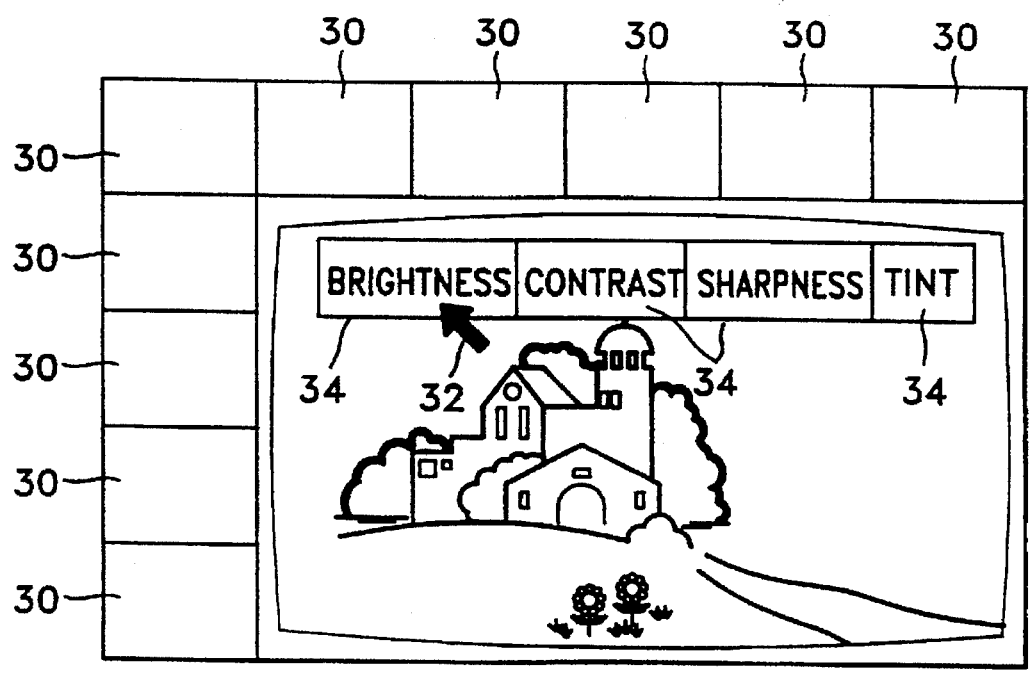

Step 140 is a step in which the desired icon of the sub-menu displayed in step 130 is selected. Here, the cursor 32 is moved based on the same principle as in step 110 onto a sub-menu icon controlling, for example, screen brightness, as shown in FIG. 2D.

Figure 2E:
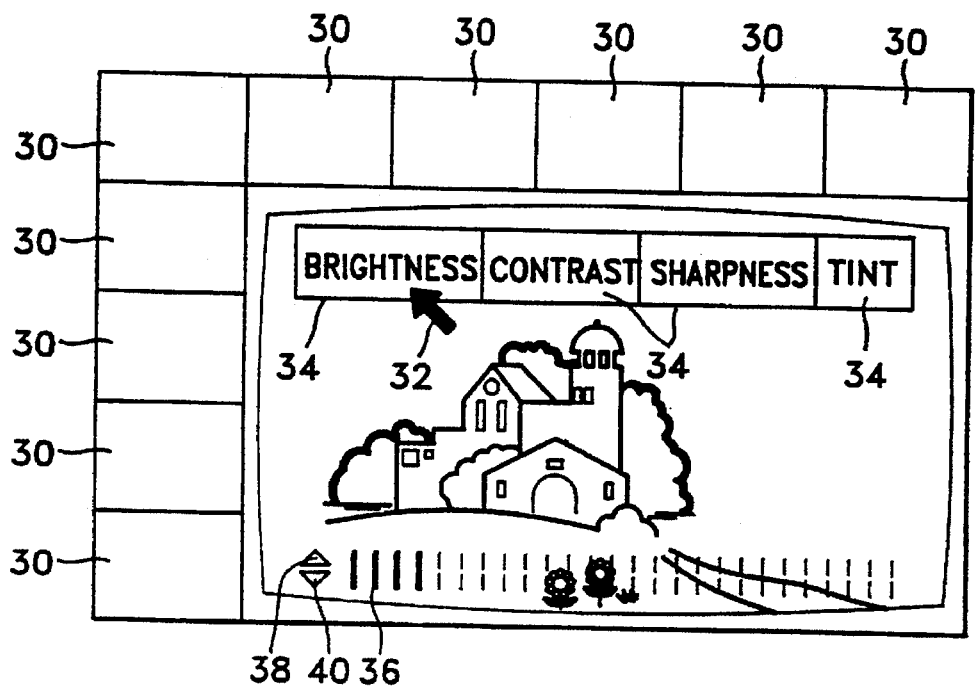

Step 150 is a step in which the function corresponding to the brightness-control icon is performed by pressing the enter key, whereby the corresponding control mode is entered. In step 160, the display screen for the selected control mode is displayed, as shown in FIG. 2E. Here the varying degree of control (in this case, brightness) corresponds to the number of highlighted bars 36 displayed among the maximum number of those displayable, shown as dotted lines arrayed across the bottom of the screen.

Figure 2F:
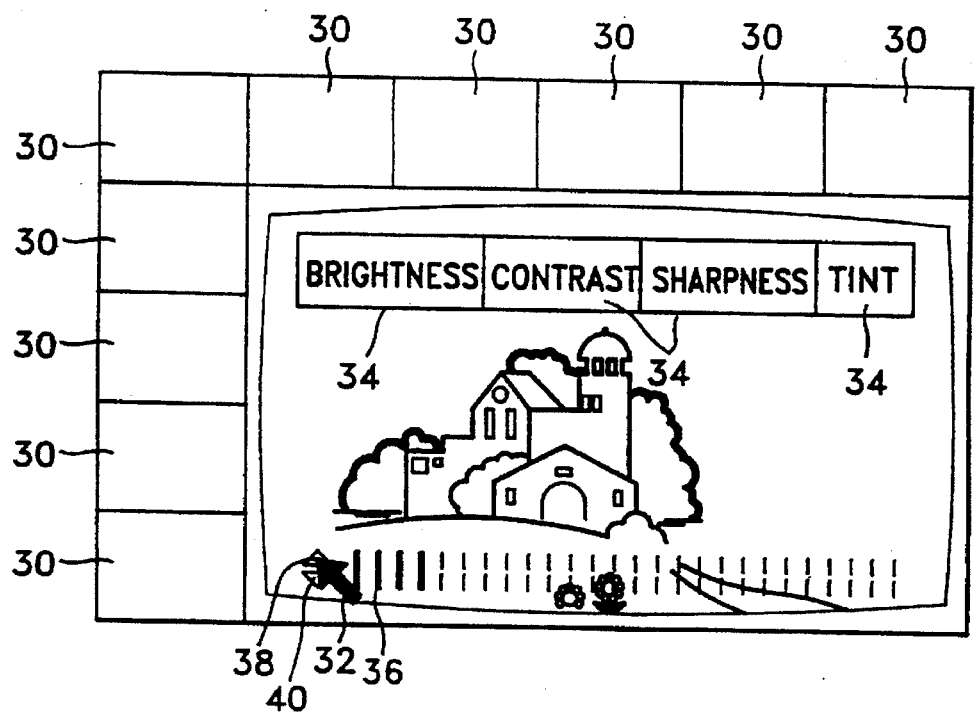

In step 170, the cursor is located on one of the triangular icons 38, 40 to allow a user to increase or decrease a controlled parameter. As step 170 is illustrated in FIG. 2F, the cursor is located on the upwardly pointing triangular icon 38, which increases the control mode displayed in step 160, e.g., television brightness. Likewise, operation of the downwardly pointing icon 40 would decrease the displayed control mode.

Figure 2G:
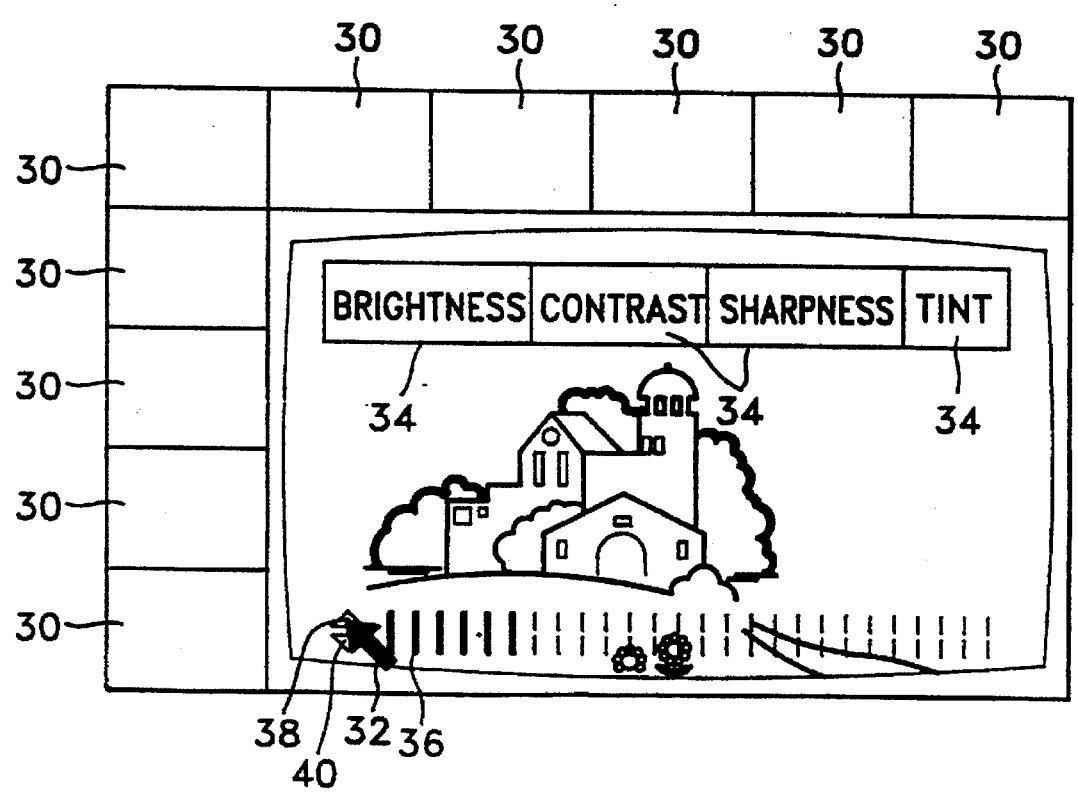

Step 180 is a step in which an enter key is pressed after the cursor position is fixed in step 170. The appearance of the display upon pressing the enter key according to step 180 is shown in FIG. 2G. The repeated or continuous pressing of the enter key results in a continuance of the control-mode display, while the absence of enter-key operation for a predetermined time causes the control mode to revert to the previous screen display. The number of highlighted bars 36 increases or decreases corresponding to which triangular icon the cursor is on and the pressing of the enter key.

Figure 3:
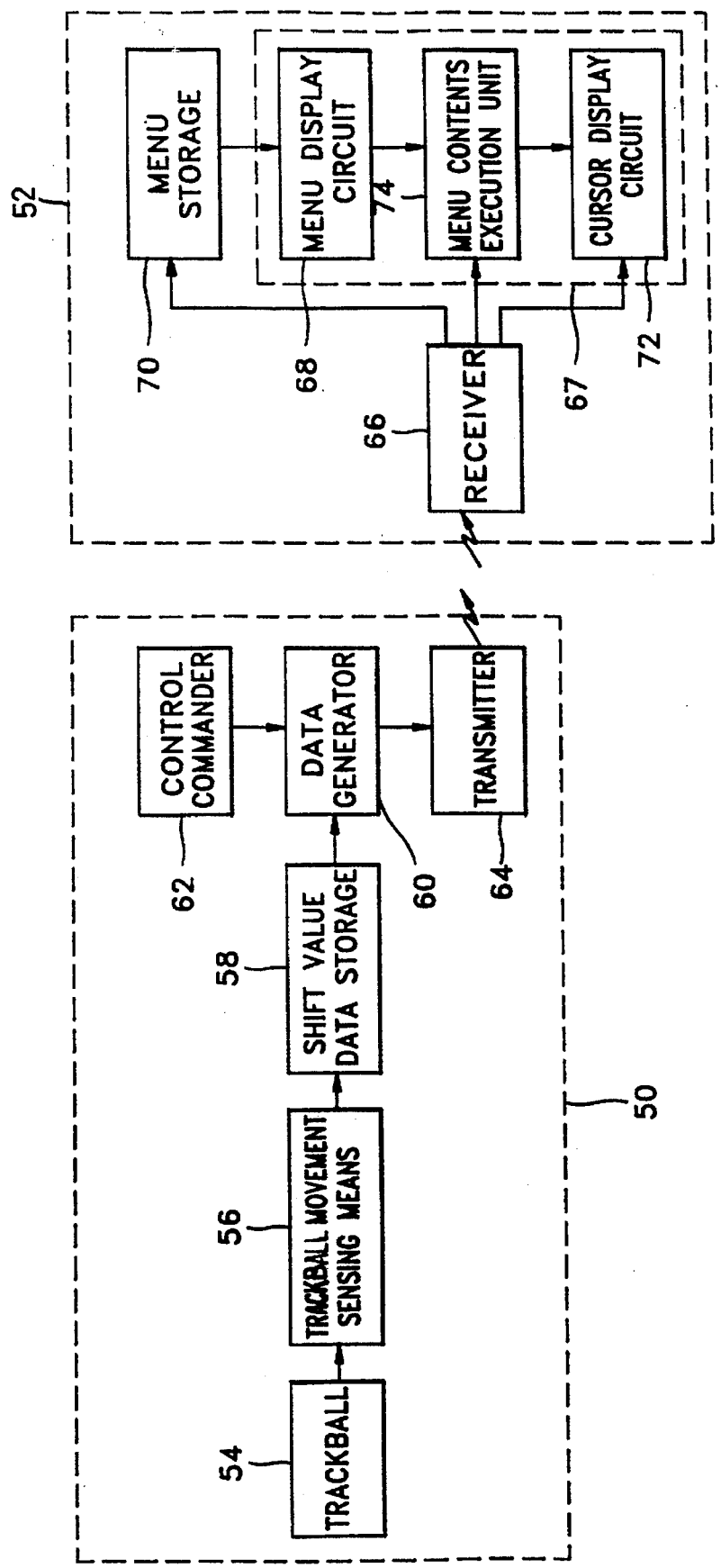
FIG. 3 is a schematic view for illustrating a remote control system according to the present invention.

FIG. 3 is a schematic view for illustrating an apparatus according to the present invention, roughly comprising a remote controller 50 and an electrical appliance 52 (e.g., a television). In FIG. 3, reference numeral 54 denotes a trackball, reference numeral 56 denotes a trackball movement sensor, reference numeral 58 denotes a shift value data storage unit, reference numeral 60 denotes a data generator, reference numeral 62 denotes a control commander, reference numeral 64 denotes a transmitter, reference numeral 66 denotes a receiver, reference numeral 70 denotes a menu storage unit, and reference numeral 67 denotes a menu display control unit comprising a menu display circuit 68, a cursor display circuit 72 and a menu contents execution unit 74. Here, the elements 54–64 are components of the remote controller, while elements 66–74 belong to the television (or electrical appliance).

In order to select an icon displayed on the screen of television 52, trackball 54 is operated, e.g., in a positive or negative X-axis direction and in a positive or negative Y-axis direction so that cursor movement is generated. In trackball movement sensor 56, the movement of trackball 54 is sensed as a position shift value. In shift value data storage unit 58, data with respect to the position shift values are stored in advance. Data generator 60 generates the data corresponding to the sensed position shift value from shift value data storage unit 58. Then, control commander 62 selects the menu icon which is displayed on the screen where the cursor is located. Finally, transmitter 64 codes and transmits the data generated by data generator 60.

Accordingly, the signal transmitted from transmitter 64 of remote controller 50 is received by receiver 66 of television 52. Then, by pressing the menu key of remote controller 52, menu display circuit 68 displays the various menus of a television and other electrical appliances connected therewith, which are stored in menu display storage unit 70. Here, menu display storage unit 70 also stores the sub-menus and control mode displays as well. Meanwhile, the cursor is displayed by cursor display circuit 72, according to movement of trackball 54. Menu contents execution unit 74 executes the function of the selected icon where the cursor is located, according to the operation of control commander 62.

Thus, the present invention provides the user-friendly operation of electrical appliances and facilitates remote controller operation by reducing the number of keys on the controller.

What is claimed is:

1. A remote control for controlling one or more electrical appliances, wherein icons associated with respective control functions are displayed on a display screen, said remote control comprising:

a trackball for controlling the movement of a pointer on the screen relative to a predetermined initial position of the pointer on the screen to select a displayed icon;

a trackball movement sensing means for sensing a shift value of the movement of said trackball along X-Y coordinates relative to the predetermined initial position of the pointer;

a shift value data storage unit for storing shift value data corresponding to the movement of said trackball relative to the initial pointer position;

a command means for selecting the control function corresponding to the icon where the pointer is located when said command means is activated;

data generating means, responsive to said command means, for generating data corresponding to the stored shift value of said trackball received from said shift value data storage unit when said command means is activated; and transmitting means for coding and transmitting the data from said data generating means to a receiver.

2. A remote control method for performing the remote control of one or more electrical appliances wherein icons associated with respective control functions for controlling the electrical appliances and a pointer are displayed on a screen said method comprising the steps of:

displaying said menu icons and pointer on said screen by operating a remote controller, wherein said pointer is initially displayed at a predetermined position of said screen according to an initial X-Y coordinate;

moving said pointer around the screen relative to the predetermined initial position of the cursor to select a desired control function associated with an icon;

determining a shift value of a position of said pointer based on said predetermined position of the pointer;

storing said shift value; and operating a command key thereby selecting a control function corresponding to the respective control function of said menu icon on which said pointer is located when said command key is operated;

generating control data based on said stored shift value.

3. A remote control system comprising an electrical appliance having a display portion for displaying icons corresponding to respective control functions, and a remote controller for controlling the electrical appliance by transmitting data thereto;

wherein said remote controller comprises:

a trackball for controlling the movement of a pointer on the display portion relative to a predetermined initial position of the pointer on the screen to select a displayed icon;

a trackball movement sensing means for sensing a shift value of the movement of said trackball along X-Y coordinates relative to the predetermined initial position, a shift value data storage unit for storing shift value data corresponding to the movement of said trackball relative to the initial pointer position;

a command means for selecting the control function corresponding to the icon where the pointer is located when said command means is activated;

data generating means responsive to said command means for generating data corresponding to the stored shift value of said trackball received from said shift value data storage unit, when said command means is activated; and transmitting means for coding and transmitting the data from said data generating means to said electrical appliance; and wherein said electrical appliance comprises:

receiving means for receiving, as received data, the data transmitted by said transmitting means;

display control unit, connected to said receiving means, for displaying a menu on said display portion according to said received data; and menu storage means, connected to said display control unit, for providing data which is displayed on said display portion.

4. The remote control system according to claim 3, wherein said electrical appliance further comprises:

a pointer display circuit, connected to said receiving means and responsive to said received data, for providing a pointer image to be displayed on said display portion, and a menu contents execution unit, connected to said receiving means and responsive to said received data, for performing a function associated with the selected icon.

5. The remote control of claim 1, wherein one of the electrical appliances is a television.

6. A remote control system including an electrical appliance having a display for displaying icons corresponding to respective control functions, and a remote control;

wherein said remote control comprises:

a trackball for generating position data for a pointer relative to a predetermined initial position of the pointer on the display, an enter key for generating selection data based on said position data, and a transmitting means, coupled to said trackball and said enter key, for transmitting said position data and said selection data to said electrical appliance; and wherein said electrical appliance comprises:

a receiving means for receiving as received data the data transmitted by said transmitting means, a menu display mean, coupled to said receiving means, for displaying a menu on said display corresponding to said received data, a pointer display means, coupled to said receiving means and responsive to said received data, for displaying a cursor image on said display corresponding to said received data, and an execution unit, connected to said receiving means and responsive to said received data, for performing a respective function associated with the selected icon.

* * * * *